(12) United States Patent
Eschbaumer

(10) Patent No.: US 11,018,669 B2
(45) Date of Patent: May 25, 2021

(54) INTERFACE CIRCUITRY WITH SERIES SWITCH AND SHUNT ATTENUATOR

(71) Applicant: Intel IP Corporation, Santa Clara, CA (US)

(72) Inventor: Maximilian Eschbaumer, Munich (DE)

(73) Assignee: Intel IP Corporation, Santa Clara, CA (US)

(*) Notice: Subject to any disclaimer, the term of this patent is extended or adjusted under 35 U.S.C. 154(b) by 0 days.

(21) Appl. No.: 16/767,288

(22) PCT Filed: Mar. 7, 2018

(86) PCT No.: PCT/US2018/021296
§ 371 (c)(1),
(2) Date: May 27, 2020

(87) PCT Pub. No.: WO2019/172903
PCT Pub. Date: Sep. 12, 2019

(65) Prior Publication Data
US 2020/0403615 A1    Dec. 24, 2020

(51) Int. Cl.
*H03K 17/10* (2006.01)
*H03K 17/687* (2006.01)
(Continued)

(52) U.S. Cl.
CPC ....... *H03K 19/018507* (2013.01); *H03K 5/01* (2013.01); *H03K 17/6871* (2013.01); *H03K 17/693* (2013.01)

(58) Field of Classification Search
None
See application file for complete search history.

(56) References Cited

U.S. PATENT DOCUMENTS 4,978,932 A * 12/1990 Gupta ............... H01P 1/22
327/313
5,777,530 A * 7/1998 Nakatuka ............ H01P 1/15
333/104

(Continued)

OTHER PUBLICATIONS

PCT International Search Report, Search Report issued for PCT/US2018/021296, 5 pgs., dated Nov. 19, 2018.
(Continued)

*Primary Examiner* — Kenneth B Wells
(74) *Attorney, Agent, or Firm* — Schiff Hardin LLP

(57) ABSTRACT

Methods, systems, and circuities for selectively connecting an RF signal to front end circuitry and selectively attenuating the RF signal are disclosed. In one example, an interface circuitry includes switching circuitry and attenuator circuitry. The switching circuitry is connected in series between an output of an amplifier and a front end circuitry configured to transmit a radio frequency (RF) signal output by the amplifier. The switching circuitry connects the output of the amplifier to a selected one or more front end circuitry inputs to create one or more signal paths. The attenuator circuitry is connected between the output of the amplifier and ground to create an attenuation path in a shunt configuration relative to the one or more signal paths. The attenuator circuitry is configured to attenuate the RF signal.

20 Claims, 5 Drawing Sheets

(51) Int. Cl.
    *H03K 17/693*    (2006.01)
    *H03H 11/02*     (2006.01)
    *H03H 11/24*     (2006.01)
    *H03K 19/0185*   (2006.01)
    *H03K 5/01*      (2006.01)

(56) References Cited

U.S. PATENT DOCUMENTS

| | | | |
|---|---|---|---|
| 6,683,511 B2 * | 1/2004 | Souetinov | H03H 11/245 |
| | | | 327/308 |
| 8,890,598 B2 * | 11/2014 | Jordan | H03H 7/25 |
| | | | 327/308 |
| 9,628,075 B2 | 4/2017 | Cebi et al. | |
| 2012/0025927 A1 | 2/2012 | Yan et al. | |
| 2013/0127495 A1 | 5/2013 | Miyazaki | |

OTHER PUBLICATIONS

Im Donggu et al: "A Stacked-FET Linear SOI CMOS Cellular Antenna Switch With an Extremely Low-Power Biasing Strategy", IEEE Transactions on Microwave Theory and Techniques, Plenum, USA, vol. 63, No. 6, Jun. 1, 2015 (Jun. 1, 2015), pp. 1964-1977, XP011583014, ISSN: 0018-9480, DOI: 10.1109/TMTT.2015. 2427801.
International Preliminary Report dated Sep. 6, 2020V for PCTApplication No. PCT/US2018/021296.

\* cited by examiner

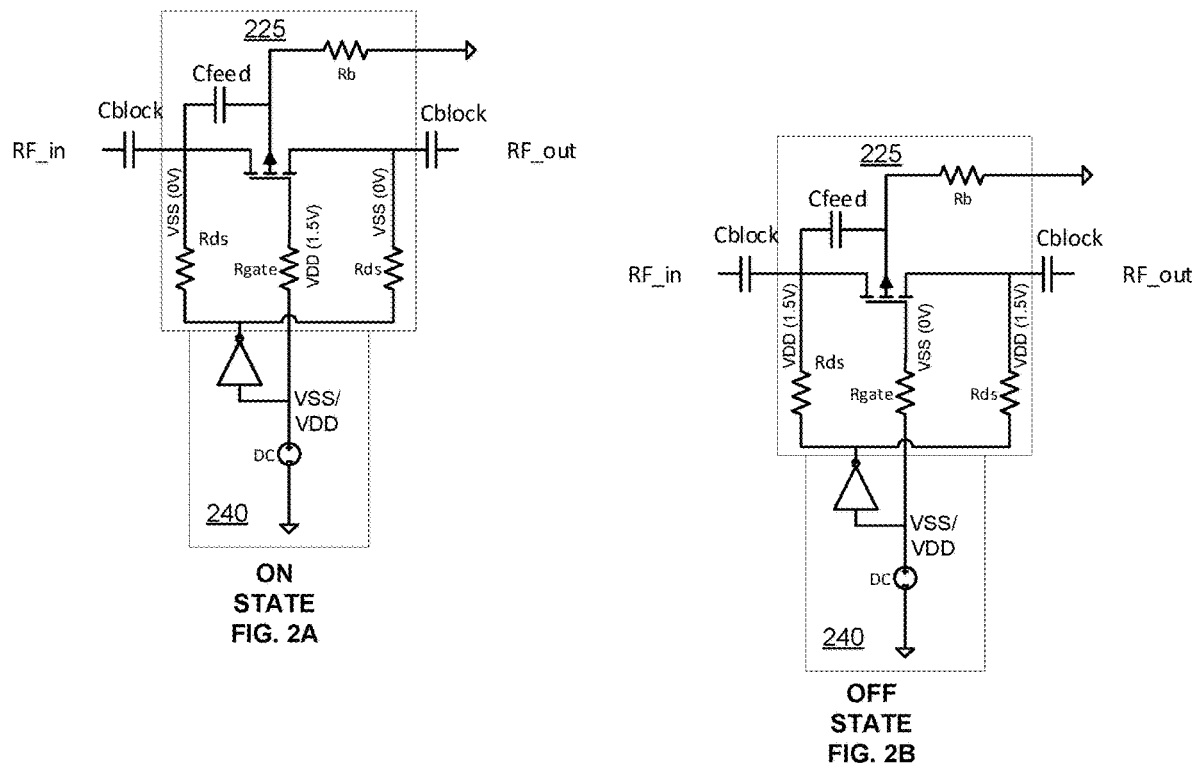
ON STATE
FIG. 2A
OFF STATE
FIG. 2B
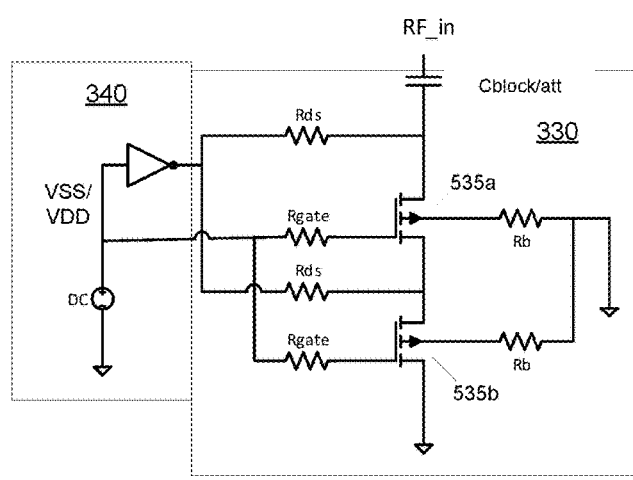
FIG. 3

INTERFACE CIRCUITRY WITH SERIES SWITCH AND SHUNT ATTENUATOR

BACKGROUND

Modern transceivers are called on to support carrier aggregation over very wide frequency ranges. Often this means that the transceiver front end includes multiple processing chains, with each chain being optimized for a different frequency band. Interface circuitry in the transceiver selectively routes the transmit RF signal from the transceiver's linear RF amplifiers to one or more of the front end processing chains.

BRIEF DESCRIPTION OF THE DRAWINGS

FIGS. 2A and 2B illustrate an example switch circuitry including a biasing network and control circuitry in an on-state and off-state, respectively, in accordance with various aspects described.

FIG. 3 illustrates an example attenuation circuitry including a biasing network and control circuitry in accordance with various aspects described.

DESCRIPTION

Figure 1:
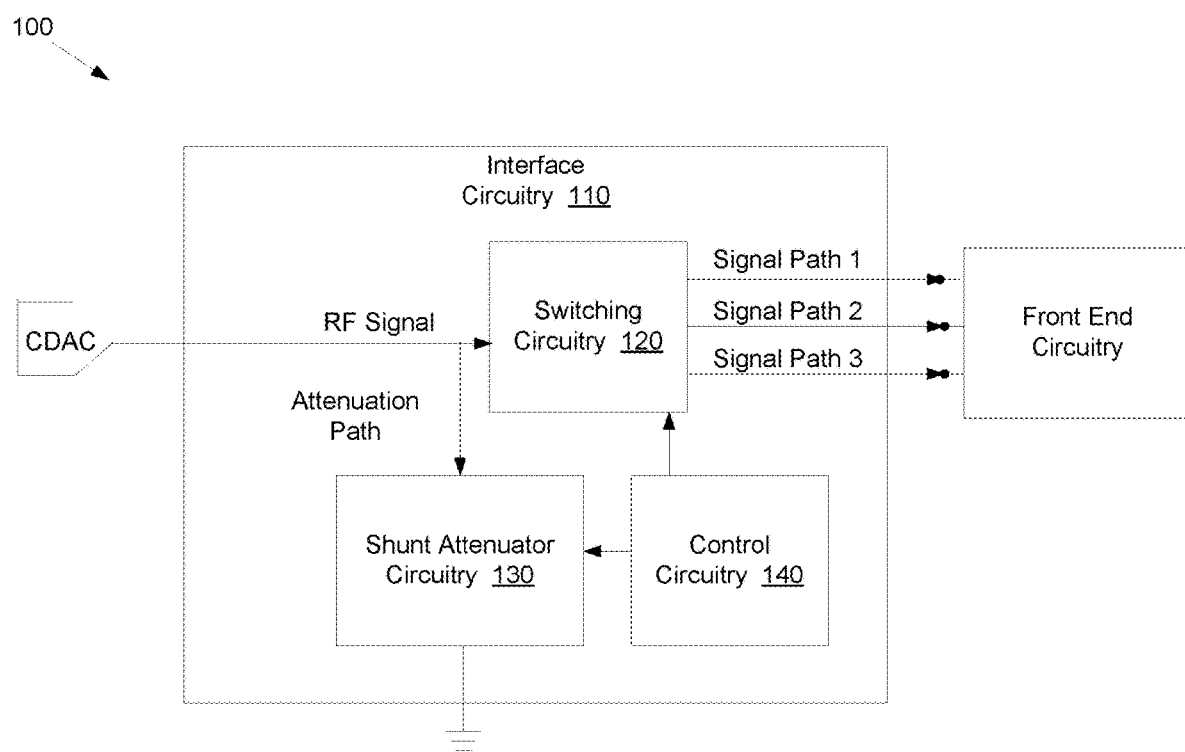
FIG. 1 illustrates an example interface system in accordance with various aspects described.

In addition to routing the transmit signal to the appropriate front end processing chain(s), interface circuitry may also attenuate the transmit signal depending on the signal power best suited for a given front end processing chain. This attenuation capability allows power amplifiers in the transceiver (e.g., amplifiers associated with a capacitive digital to analog converter based power amplifier (CDAC)) to be operated in a higher power region, which in turn results in improved signal quality. The performance of the components in the interface circuitry, and the resulting output power of the interface, may vary depending on temperature. This means that calibration of the interface circuitry at different temperatures may be beneficial. However, performing different calibration operations at different temperatures is time consuming and expensive.

Described herein are interface systems, methods, and circuitries that provide a signal path controlled by switches connected in series between an amplifier producing the RF transmit signal and several front end circuitry inputs and an attenuation path for the RF transmit signal arranged as a shunt with respect to the signal path. This "series switch and shunt attenuation" interface circuitry exhibits a lower temperature dependence than other interface circuitries that include a shunt switch arrangement with a shunt attenuation path. As temperature increases, the attenuation provided by the shunt attenuation path decreases. However, as temperature increases, the losses incurred in the series switches increase, compensating for the decreased attenuation. This means that the described interface circuitries may be calibrated at a single temperature, reducing cost.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates an example interface system 100 that includes interface circuitry 110 disposed between a CDAC and front end circuitry of a transceiver. For the purposes of this description, a CDAC or more generically, "an amplifier" will be the source of the RF signal input to the interface circuitry 110. However, in some examples, a different source (e.g., digital to analog converter (DAC), low noise amplifier (LNA), and so on) may generate the RF signal. Further, a matching network (not shown in FIG. 1) may be disposed between the CDAC or other source and the interface circuitry 110.

The interface circuitry 110 includes series switching circuitry 120, shunt attenuator circuitry 130, and control circuitry 140. The series switching circuitry 120 is connected in series between the CDAC and the front end circuitry. The series switching circuitry 120 selectively connects the output of the CDAC to one or more inputs of the front end circuitry to create one or more signal paths. The shunt attenuator circuitry 130 is connected between the output of the CDAC and ground, to create an attenuation path in a shunt configuration with respect to the signal path(s). As discussed in more detail below, the control circuitry 140 controls individual switches (e.g., metal oxide semiconductor field effect transistors (MOSFETs)) in the series switching circuitry 120 and attenuator circuitry 130 to selectively open or close the various signal paths and the attenuation path.

FIGS. 2A and 2B illustrate an example switch circuitry 225 in an on-state and an off-state, respectively. The switch circuitry 225 includes a MOSFET and a biasing network which includes resistors Rds, Rgate, Rb, and Rds. The switching circuitry 120 (FIG. 1) includes a switch circuitry 225 in each of the signal paths. The biasing network resistors have values that cause the voltage at the MOSFET's drain node to be similar or equivalent to the RF signal being switched. This makes the body and gate of the MOSFET "AC floating" and protects the MOSFET from high transients due to the switching of high voltage RF signals. Here "equivalent" or "similar" means that the voltage at the drain node has the same amplitude or has the RF signal, or an amplitude or magnitude that is similar enough to the RF signal to sufficiently to protect the MOSFET from damage due to transients during switching.

In one example, as shown in FIG. 2A, during the on-state (i.e., MOSFET conducting the RF signal from drain to source), the drain, source, gate, and body nodes of the MOSFET are biased to the equivalent voltage as the RF signal. This is accomplished by control circuitry 240 and biasing network providing VDD (e.g., 1.5 V DC) to the gate node of the MOSFET and VSS (e.g., 0 volts or ground) to the drain node and source node of the MOSFET. A feedforward capacitor Cfeed is connected between the drain node and body node of the MOSFET to provide a low-impedance path. Blocking capacitors Cblock are connected at the input (drain node) and output (source node) of the MOSFET to provide DC isolation for an impedance matching network (not shown) between the CDAC and interface circuitry.

In the off-state, as shown in FIG. 2B, the control circuitry 240 and biasing network provides VSS (e.g., 0 volts or ground) to the gate node of the MOSFET and VDD (e.g., 1.5 V) to the drain node and source node of the MOSFET. This operates the MOSFET in deep cut off mode so that the switch circuitry 225 is able to handle RF signals up to 3.5 volts while providing good isolation to minimize power loss through the switched-off MOSFET. It is noted that either NMOS type FETs or PMOS type FETS may be utilized, with appropriate changes to VSS and VDD and/or the biasing network. If a FET placed in a triple well is used, another capacitor (not shown) may be connected from the well to VSS to shunt any RF signal coupling to the well to prevent a diode from opening to the substrate.

FIG. 3 illustrates an example attenuator circuitry 330 that is formed by a capacitor Cblock/att and a switch in series connection, which together are connected in shunt with respect to the signal path controlled by the series switching circuitry 120 (FIG. 1). While a single Cblock/att capacitor is shown, a separate Cblock and attenuator capacitors may be used. The attenuation level provided by the attenuator circuitry depends on the switch's on-resistance and the capacitance of the blocking and attenuator capacitor. The on-resistance and capacitor value are chosen to achieve 5-10 dB attenuation. The attenuator circuitry 330, when used in shunt with respect to the RF signal path, compensates the temperature dependency of the attenuation. In one example, the temperature dependency of the attenuation can be kept within 0.5 dB.

The attenuator circuitry 330 switch includes a first MOSFET 535a, a second MOSFET 535b, and a biasing network which includes resistors (2) Rds, (2) Rgate, and (2) Rb. The use of two stacked MOSFETs blocks the high voltage swings occurring in the RF signal being attenuated. The biasing network resistors have values that cause the voltage at both MOSFETs' drain nodes to be similar or equivalent to the RF signal being switched. In one example, during the on-state (i.e., MOSFET conducting the RF signal from drain to source), the drain, source, gate, and body nodes of the MOSFETs are biased to the equivalent voltage as the RF signal. This is accomplished by control circuitry 340 and biasing network providing VDD (e.g., 1.5 V DC) to the gate nodes of the MOSFETs and VSS (e.g., 0 volts or ground) to the drain node and source node of the MOSFETs. This makes the body and gate of the first MOSFET and also the body of the second MOSFET "AC floating," thereby protecting the MOSFET from high transients due to the switching of high voltage RF signals. In one example, the body node of the second MOSFET can be tied to VSS without a significant impact on performance.

The attenuator can be connected prior to the switches but also before the output side blocking cap in every switch path. If connected in the latter way it can be reused to increase isolation in the off-state, leading to very high isolation values above 20 dB.

Figure 4:
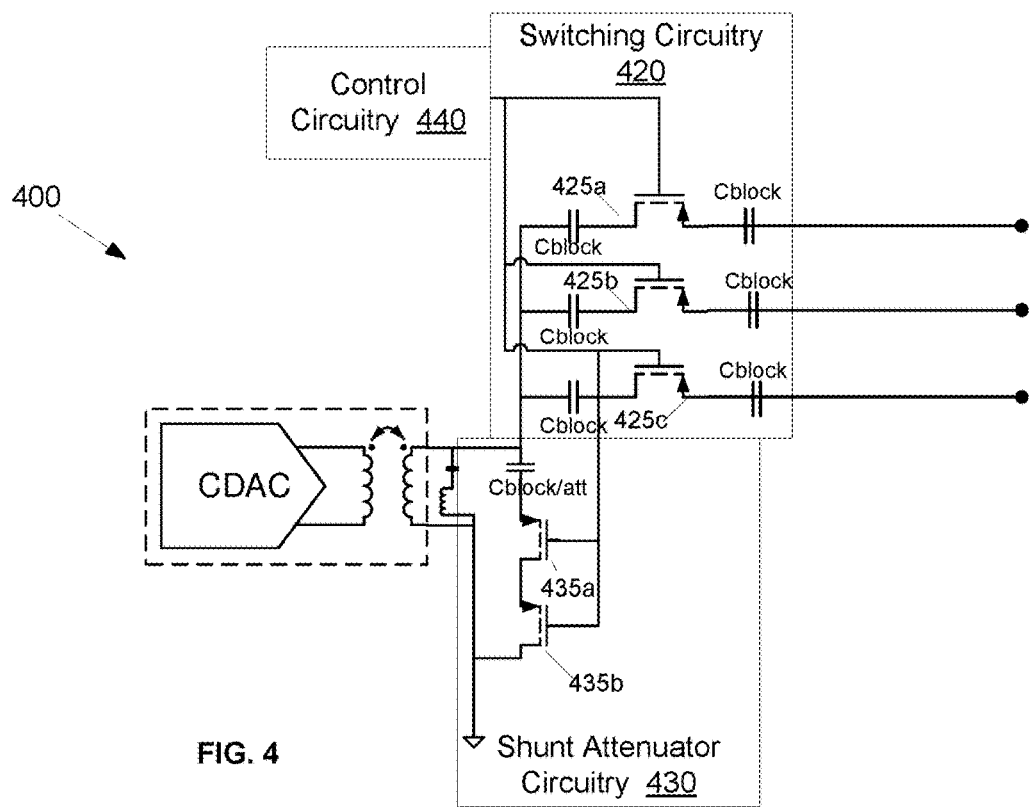
FIG. 4 illustrates another example interface system in accordance with various aspects described.

FIG. 4 illustrates an example interface system 400 that selectively connects an RF signal from a CDAC to one of three inputs of a front end circuitry (not shown in FIG. 4). The output of the CDAC is provided to series switching circuitry 420 and shunt attenuator circuitry 430 through a matching network (e.g., the illustrated transformer and LC circuit). In this particular example the number of outputs of the series switching circuitry 420 is three but any number of outputs may be used. In the example of FIG. 4, a single instance of the attenuator circuitry 430 is connected prior to the switch circuitries (225a, 225b, 225c) and also the blocking capacitor. Control circuitry 440 controls the MOS- FETs in the series switching circuitry 420 to select one of more signal paths that will carry the signal to the front end circuitry. The control circuitry 440 controls the MOSFETs in the shunt attenuator circuitry 430 to connect or disconnect the attenuation path for the RF signal.

Figure 5:
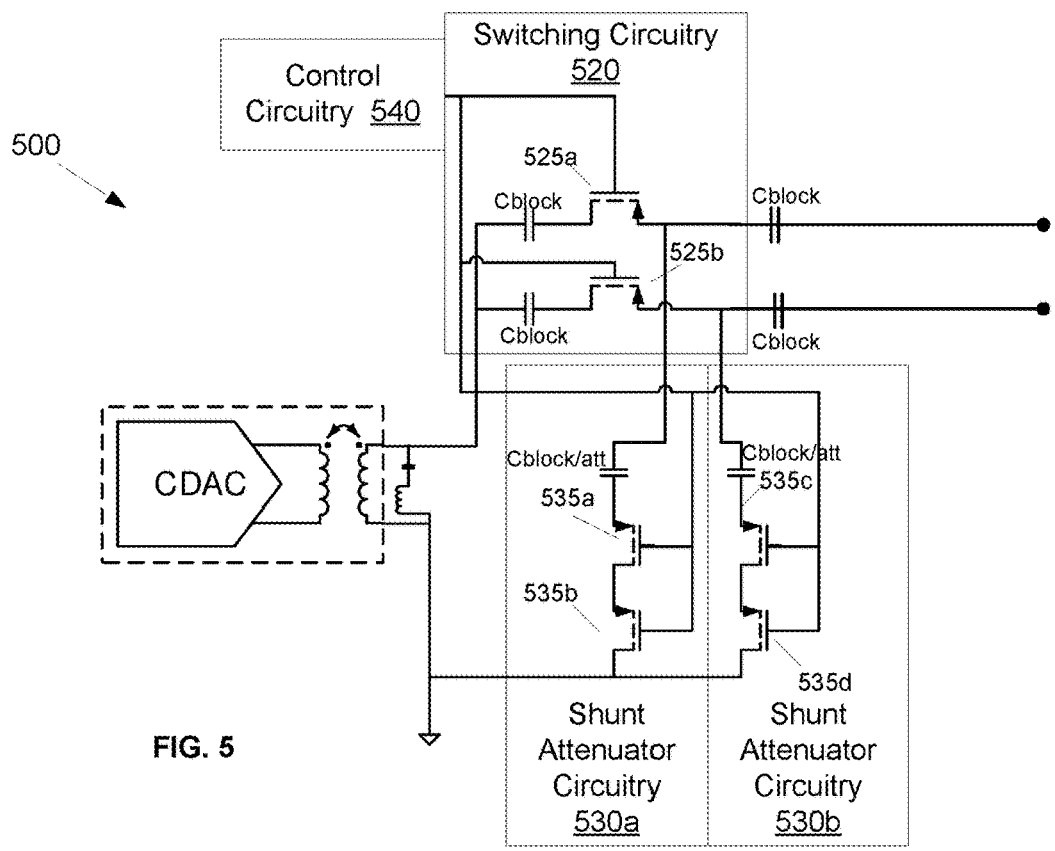
FIG. 5 illustrates another example interface system in accordance with various aspects described.

FIG. 5 illustrates an example interface system 500 that selectively connects an RF signal from a CDAC to one of three inputs of a front end circuitry (not shown in FIG. 5). The output of the CDAC is provided to series switching circuitry 520 and two instances of a shunt attenuator circuitry 530a, 530b through a matching network (e.g., the illustrated transformer and LC circuit). Control circuitry 540 controls the MOSFETs in the series switching circuitry 520 to select one of more signal paths that will carry the signal to the front end circuitry. The control circuitry 540 controls the MOSFETs in the shunt attenuator circuitry 530a, 530b to connect or disconnect the selected respective attenuation path for the RF signal.

In the example of FIG. 5, two instances of the attenuator circuitry 530a, 530b are placed between each switch circuitry 525 of series switching circuitry 520 and their corresponding blocking capacitors. However, any number N of instances of the attenuator circuitry may be used to provide very high off-state isolation.

Figure 6:
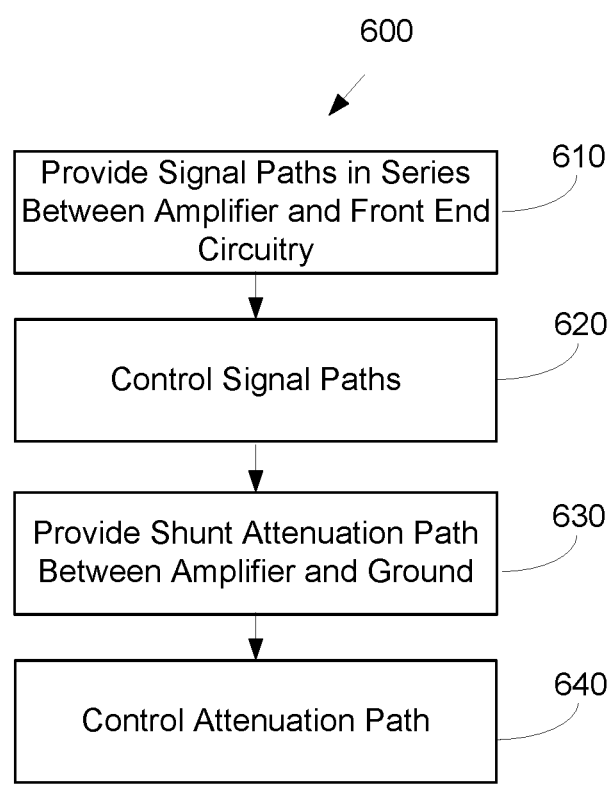
FIG. 6 illustrates a flow diagram of an example method of selectively routing and attenuating a radio frequency signal from a radio frequency amplifier to a front end circuitry in accordance with various aspects described.

FIG. 6 illustrates a flow diagram outlining an example method configured to selectively route and attenuate a radio frequency signal from a radio frequency amplifier to a front end circuitry. The method includes, at 610, providing one or more parallel signal paths, each in series between an output of an amplifier and a front end circuitry configured to transmit a radio frequency (RF) signal output by the amplifier. At 620, each signal path is controlled to selectively connect the output of the amplifier to one or more front end circuitry inputs to create one or more signal paths. At 630, the method includes providing an attenuation path between the output of the amplifier in a shunt configuration relative to the one or more signal paths. At 640, the attenuation path is controlled to selectively attenuate the RF signal.

Figure 7:
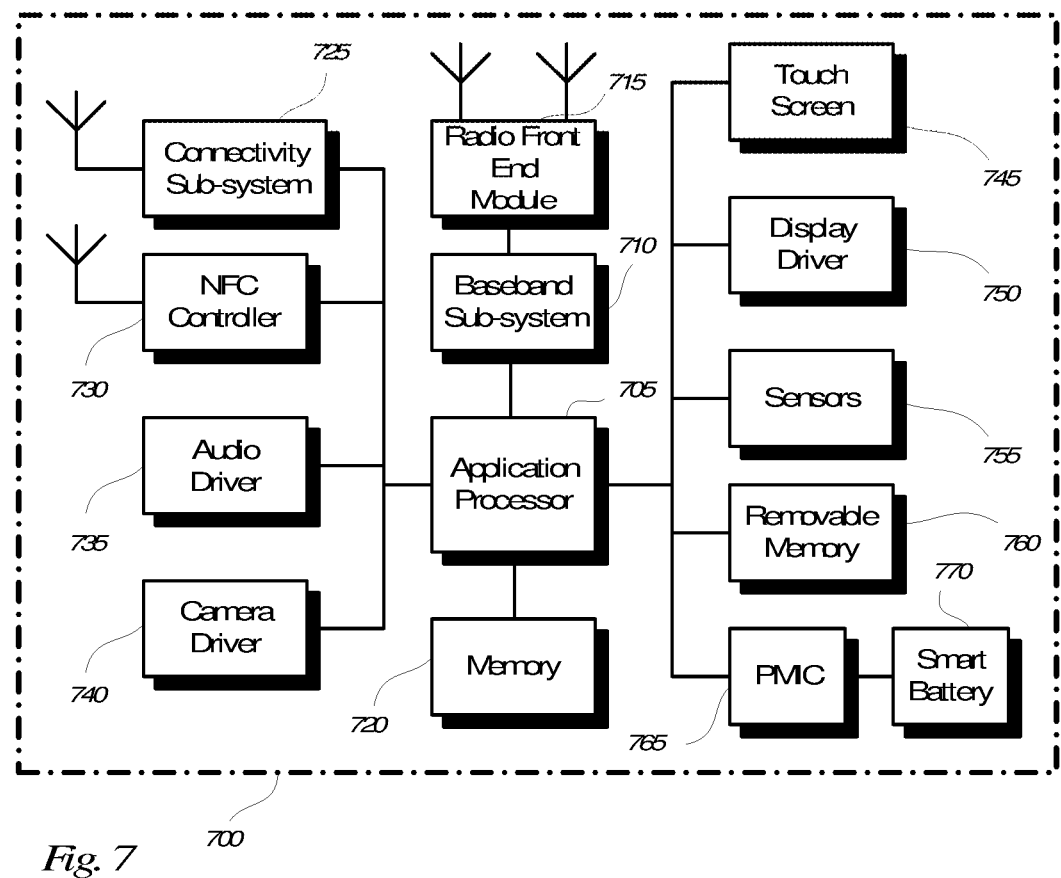
FIG. 7 illustrates an example user device including front end circuitry that can be used to embody various aspects described.

FIG. 7 illustrates a user device 700 in accordance with an aspect. The user device 700 may be a mobile device in some aspects and includes an application processor 705, baseband processor 710 (also referred to as a baseband sub-system), radio front end module (RFEM) 715, memory 720, connectivity sub-system 725, near field communication (NFC) controller 730, audio driver 735, camera driver 740, touch screen 745, display driver 750, sensors 755, removable memory 760, power management integrated circuit (PMIC) 765 and smart battery 770.

In some aspects, application processor 705 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface circuit, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband processor 710 may be implemented, for example, as a solder-down substrate including one or more integrated circuits, a single packaged integrated circuit soldered to a main circuit board, and/or a multi-chip module containing two or more integrated circuits.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for controlling the switching circuitries and attenuation circuitries according to embodiments and examples described herein.

Example 1 is an interface circuitry, including a switching circuitry connected in series between an output of an amplifier and a front end circuitry configured to transmit a radio frequency (RF) signal output by the amplifier, wherein the switching circuitry connects the output of the amplifier to a selected one or more front end circuitry inputs to create one or more signal paths. The interface circuitry includes an attenuator circuitry connected between the output of the amplifier and ground to create an attenuation path in a shunt configuration relative to the one or more signal paths, wherein the attenuator circuitry is configured to attenuate the RF signal.

Example 2 includes the subject matter of example 1, including or omitting optional elements, wherein the switching circuitry includes two or more switch circuitries in parallel to one another, wherein each switch circuitry is connected between the amplifier and one of the front end circuitry inputs. Each switch circuitry includes: a metal oxide semiconductor field effect transistor (MOSFET) connected to the output of the amplifier by a drain node and to one of the one or more front end circuitry inputs by a source node and a biasing network configured to generate a drain voltage from a control voltage, that is similar to an amplitude of the RF signal.

Example 3 includes the subject matter of example 2, including or omitting optional elements, wherein the biasing network is configured to generate a source voltage at a source node of the MOSFET that is similar to the drain voltage.

Example 4 includes the subject matter of example 1, including or omitting optional elements, further including, for each switch circuitry, a feedforward capacitor connected between the drain node and a body node of the MOSFET.

Example 5 includes the subject matter of example 2, including or omitting optional elements, further including, for each switch circuitry, a first blocking capacitor connected between the output of the amplifier and the drain node and a second blocking capacitor connected between the source node and the one of the one or more front end circuitry inputs.

Example 6 includes the subject matter of examples 1-5, including or omitting optional elements, wherein the attenuator circuitry includes a first metal oxide semiconductor field effect transistor (MOSFET) connected to the output of the amplifier by a drain node; a biasing network configured to generate, for the first MOSFET, a first drain voltage, a first gate voltage, a first body voltage, and a first source voltage from a control voltage, wherein respective amplitudes of the first drain voltage, the first gate voltage, the first body voltage, and the first source voltage are similar to an amplitude of the RF signal; and an attenuator capacitor connected between the output of the amplifier and the drain node of the first MOSFET.

Example 7 includes the subject matter of example 6, including or omitting optional elements, wherein the attenuator circuitry includes a second MOSFET connected by a drain node to a source node of the first MOSFET and connected by a source node to ground. The biasing network is configured to generate, for the second MOSFET, a second drain voltage, a second gate voltage, a second body voltage, and a second source voltage from a control voltage, wherein respective amplitudes of the second drain voltage, the second gate voltage, the second body voltage, and the second source voltage are similar to an amplitude of the RF signal.

Example 8 includes the subject matter of examples 1-5, including or omitting optional elements, further including a second attenuator circuitry connected between the output of the amplifier and ground to create a second attenuation path in a shunt configuration relative to the one or more signal paths, wherein the second attenuator circuitry is configured to attenuate the RF signal.

Example 9 includes the subject matter of examples 2 and 6, including or omitting optional elements, further including a control circuitry configured to generate one or more voltages and provide the one or more voltages to the biasing network.

Example 10 is a method configured to selectively route and attenuate a radio frequency (RF) signal from a radio frequency amplifier to a front end circuitry, including: providing one or more parallel signal path each in series between an output of the amplifier and the front end circuitry, wherein each signal path is configured to conduct the RF signal; controlling each signal path to connect or disconnect the amplifier to a selected one or more front end circuitry inputs; providing an attenuation path between the output of the amplifier in a shunt configuration relative to the one or more signal paths; controlling the attenuation path to selectively attenuate the RF signal.

Example 11 includes the subject matter of example 9, including or omitting optional elements, wherein the providing one or more parallel signal paths includes providing a switching circuitry connected in series between the amplifier and the one or more front end circuitry inputs, and the controlling each signal path includes controlling the switching circuitry to connect the amplifier to a selected one or more front end circuitry inputs to create one or more signal paths.

Example 12 includes the subject matter of example 11, including or omitting optional elements, wherein the switching circuitry includes two or more switch circuitries in parallel to one another, wherein each switch circuitry is connected between the amplifier and the front end circuitry. Each switch circuitry includes: a metal oxide semiconductor field effect transistor (MOSFET) connected to the output of the amplifier by a drain node and to one of the one or more front end circuitry inputs by a source node; and a biasing network configured to generate a drain voltage from a control voltage, that is similar to an amplitude of the RF signal. The controlling each signal path includes generating a drain voltage, a source voltage, and a gate voltage for each MOSFET in each switch circuitry to open or close an associated signal path.

Example 13 includes the subject matter of example 12, including or omitting optional elements, further including generating the drain voltage as similar to the source voltage for each MOSFET.

Example 14 includes the subject matter of example 12, including or omitting optional elements, further including, for each switch circuitry, providing a low-impedance path including a feedforward capacitor connected between the drain node and a body node of each MOSFET.

Example 15 includes the subject matter of examples 11-14, including or omitting optional elements, wherein providing the attenuation path includes providing an attenuator circuitry connected between the output of the amplifier and ground, wherein the attenuator circuitry is configured to attenuate the RF signal.

Example 16 includes the subject matter of example 15, including or omitting optional elements, wherein the attenuator circuitry includes a first metal oxide semiconductor field effect transistor (MOSFET) connected to the output of the amplifier by a drain node; a biasing network configured to generate, for the first MOSFET, a first drain voltage, a first gate voltage, a first body voltage, and a first source voltage from a control voltage, wherein respective amplitudes of the first drain voltage, the first gate voltage, the first body voltage, and the first source voltage are similar to an amplitude of the RF signal, and an attenuator capacitor connected between the output of the amplifier and the drain node of the first MOSFET. The controlling the attenuation path includes generating the first drain, the first source voltage, and the first gate voltage for the first MOSFET to open or close the attenuation path.

Example 17 includes the subject matter of example 16, including or omitting optional elements, wherein the attenuator circuitry further includes a second MOSFET connected by a drain node to a source node of the first MOSFET and connected by a source node to ground. The biasing network is configured to generate, for the second MOSFET, a second drain voltage, a second gate voltage, a second body voltage, and a second source voltage from the control voltage, wherein respective amplitudes of the second drain voltage, the second gate voltage, the second body voltage, and the second source voltage are similar to an amplitude of the RF signal. The controlling the attenuation path includes generating the second drain voltage, second source voltage, and second gate voltage for the second MOSFET to open or close the attenuation path.

Example 18 is an apparatus, including means for providing one or more parallel signal paths, wherein each signal path is in series between an output of an amplifier and a front end circuitry configured to transmit a radio frequency (RF) signal output by the amplifier; means for controlling each signal path to selectively connect the output of the amplifier to one or more front end circuitry inputs; means for providing an attenuation path between the output of the amplifier in a shunt configuration relative to the one or more signal paths; and means for controlling the attenuation path to selectively attenuate the RF signal.

Example 19 includes the subject matter of example 18, including or omitting optional elements, wherein the means for controlling each signal path includes two or more switch circuitries in parallel to one another, wherein each switch circuitry is connected between the amplifier and the front end circuitry. Each switch circuitry includes a metal oxide semiconductor field effect transistor (MOSFET) connected to the output of the amplifier by a drain node and to one of the one or more front end circuitry inputs by a source node and a biasing network configured to generate a drain voltage from a control voltage, that is equivalent to an amplitude of the RF signal.

Example 20 includes the subject matter of example 18, including or omitting optional elements, wherein the means for controlling the attenuation path includes a first metal oxide semiconductor field effect transistor (MOSFET) connected to the output of the amplifier by a drain node and a biasing network configured to generate, for the first MOSFET, a first drain voltage, a first gate voltage, a first body voltage, and a first source voltage from a control voltage, wherein respective amplitudes of the first drain voltage, the first gate voltage, the first body voltage, and the first source voltage are similar to an amplitude of the RF signal.

Example 21 includes the subject matter of example 20, including or omitting optional elements, wherein the means for controlling the attenuation path includes a second MOSFET connected by a drain node to a source node of the first MOSFET and connected by a source node to ground; wherein the biasing network is configured to generate, for the second MOSFET, a second drain voltage, a second gate voltage, a second body voltage, and a second source voltage from a control voltage, wherein respective amplitudes of the second drain voltage, the second gate voltage, the second body voltage, and the second source voltage are similar to an amplitude of the RF signal.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. An interface circuitry, comprising:
a switching circuitry connected in series between an output of an amplifier and a front end circuitry configured to transmit a radio frequency (RF) signal output by the amplifier, wherein the switching circuitry connects the output of the amplifier to a selected one or more front end circuitry inputs to create one or more signal paths,
wherein the switching circuitry includes a metal oxide semiconductor field effect transistor (MOSFET) that is connected to the output of the amplifier via a drain node and connected to one of the one or more front end circuitry inputs via a source node;
a biasing network configured to use a control voltage to generate a drain voltage at the drain node of the MOSFET, the drain voltage being equal to an amplitude of the RF signal such that a body and a gate of the MOSFET have an AC floating configuration; and
an attenuator circuitry connected between the output of the amplifier and ground to create an attenuation path in a shunt configuration relative to the one or more signal paths,
the attenuator circuitry being configured to attenuate the RF signal.

2. The interface circuitry of claim 1, wherein the switching circuitry comprises two or more switch circuitries, each one of the two or more switch circuitries forming a respective connection between the amplifier and a selected one of the one or more front end circuitry inputs.

3. The interface circuitry of claim 1, wherein the biasing network is configured to generate a source voltage at a source node of the MOSFET that is equal to the drain voltage.

4. The interface circuitry of claim 1, wherein the switching circuitry further comprises a feedforward capacitor connected between the drain node and a body node of the MOSFET.

5. The interface circuitry of claim 1, wherein the switching circuitry further comprises a first blocking capacitor connected between the output of the amplifier and the drain node, and a second blocking capacitor connected between the source node and the one of the one or more front end circuitry inputs.

6. The interface circuitry of claim 1, wherein the attenuator circuitry comprises:
a first attenuator circuitry MOSFET connected to the output of the amplifier by a drain node;
another biasing network configured to generate, for the first attenuator circuitry MOSFET, a first drain voltage, a first gate voltage, a first body voltage, and a first source voltage from an attenuator circuitry control voltage, wherein respective amplitudes of the first drain voltage, the first gate voltage, the first body voltage, and the first source voltage are equal to an amplitude of the RF signal; and an attenuator capacitor connected between the output of the amplifier and the drain node of the first attenuator circuitry MOSFET.

7. The interface circuitry of claim 6, wherein the attenuator circuitry further comprises:

a second attenuator circuitry MOSFET connected by a drain node to a source node of the first attenuator circuitry MOSFET and connected by a source node to ground, wherein the another biasing network is configured to generate, for the second attenuator circuitry MOSFET, a second drain voltage, a second gate voltage, a second body voltage, and a second source voltage from the attenuator circuitry control voltage, wherein respective amplitudes of the second drain voltage, the second gate voltage, the second body voltage, and the second source voltage are equal to an amplitude of the RF signal.

8. The interface circuitry of claim 1, further comprising:

a second attenuator circuitry connected between the output of the amplifier and ground to create a second attenuation path in a shunt configuration relative to the one or more signal paths, and wherein the second attenuator circuitry is configured to attenuate the RF signal.

9. The interface circuitry of claim 1, further comprising a control circuitry configured to generate the control voltage and to provide the control voltage to the biasing network.

10. A method to selectively route and attenuate a radio frequency (RF) signal from a RF amplifier to a front end circuitry having one or more front end circuitry inputs, comprising:

providing one or more signal paths, each respective one of the one or more signal paths being in series with an output of the amplifier and the front end circuitry, each respective one of the signal paths being configured to conduct the RF signal;

wherein providing the one or more signal paths comprises providing a switching circuitry connected in series between the RF amplifier and the one or more front end circuitry inputs, the switching circuitry including a metal oxide semiconductor field effect transistor (MOSFET) that is connected to the output of the RF amplifier via a drain node and connected to one of the one or more front end circuitry inputs via a source node;

controlling each signal path by controlling the switching circuitry to connect or disconnect the RF amplifier to a selected one of the one or more front end circuitry inputs to create a respective one of the one or more signal paths, wherein controlling each signal path comprises generating, via a biasing network using a control voltage, a drain voltage at the drain node of the MOSFET, the drain voltage being equal to an amplitude of the RF signal such that a body and a gate of the MOSFET have an AC floating configuration;

providing an attenuation path connected between the output of the amplifier and ground in a shunt configuration relative to the one or more signal paths; and controlling the attenuation path to selectively attenuate the RF signal.

11. The method of claim 10, wherein the switching circuitry comprises two or more switch circuitries forming a respective connection between the RF amplifier and a selected one of the one or more front end circuitry inputs, wherein controlling each signal path comprises generating the drain voltage, a source voltage, and a gate voltage for each MOSFET in each respective one of the two or more switch circuitries to open or close an associated one of the one or more signal paths.

12. The method of claim 11, further comprising generating the drain voltage as equal to the source voltage for each MOSFET in each respective one of the two or more switch circuitries.

13. The method of claim 11, further comprising, for each respective one of the two or more switch circuitries, providing a low-impedance path including a feedforward capacitor connected between the drain node and a body node of each respective MOSFET.

14. The method of claim 10, wherein:

providing the attenuation path comprises providing an attenuator circuitry connected between the output of the RF amplifier and ground, wherein the attenuator circuitry is configured to attenuate the RF signal.

15. The method of claim 14, wherein the attenuator circuitry comprises:

a first attenuator circuitry MOSFET connected to the output of the RF amplifier by a drain node;

another biasing network configured to generate, for the first attenuator circuitry MOSFET, a first drain voltage, a first gate voltage, a first body voltage, and a first source voltage from an attenuator circuitry control voltage, wherein respective amplitudes of the first drain voltage, the first gate voltage, the first body voltage, and the first source voltage are equal to an amplitude of the RF signal; and an attenuator capacitor connected between the output of the RF amplifier and the drain node of the first attenuator circuitry MOSFET, wherein controlling the attenuation path comprises generating the first drain voltage, the first source voltage, and the first gate voltage for the first attenuator circuitry MOSFET to open or close the attenuation path.

16. The method of claim 15, wherein the attenuator circuitry further comprises:

a second attenuator circuitry MOSFET connected by a drain node to a source node of the first MOSFET and connected by a source node to ground, wherein the another biasing network is configured to generate, for the second attenuator circuitry MOSFET, a second drain voltage, a second gate voltage, a second body voltage, and a second source voltage from the attenuator circuitry control voltage, wherein respective amplitudes of the second drain voltage, the second gate voltage, the second body voltage, and the second source voltage are equal to an amplitude of the RF signal, and wherein the controlling the attenuation path comprises generating the second drain voltage, the second source voltage, and the second gate voltage for the second attenuator circuitry MOSFET to open or close the attenuation path.

17. An apparatus, comprising:

means for providing one or more signal paths, wherein each signal path is coupled in series between an output of an amplifier and a front end circuitry having one or more front end circuitry inputs, the front end circuitry being configured to transmit a radio frequency (RF) signal output by the amplifier;

wherein providing the one or more signal paths comprises providing a switching means connected in series between the amplifier and the one or more front end circuitry inputs, the switching means including a metal oxide semiconductor field effect transistor (MOSFET) that is connected to the output of the amplifier via a drain node and connected to one of the one or more front end circuitry inputs via a source node;

means for controlling each signal path by controlling the switching means to selectively connect the output of the amplifier to the one or more front end circuitry inputs;

wherein controlling each signal path comprises generating, via a biasing network using a control voltage, a drain voltage at the drain node of the MOSFET, the drain voltage being equal to an amplitude of the RF signal such that a body and a gate of the MOSFET have an AC floating configuration;

means for providing an attenuation path between the output of the amplifier and ground in a shunt configuration relative to the one or more signal paths; and means for controlling the attenuation path to selectively attenuate the RF signal.

18. The apparatus of claim 17, wherein the means for controlling each signal path comprises two or more switch circuitries forming a respective connection between the amplifier and a selectively connected one of the one or more front end circuitry inputs.

19. The apparatus of claim 17, wherein the means for controlling the attenuation path comprises:

a first attenuation path MPSFET connected to the output of the amplifier by a drain node; and another biasing network configured to generate, for the first attenuation path MOSFET, a first drain voltage, a first gate voltage, a first body voltage, and a first source voltage from an attenuation path control voltage, wherein respective amplitudes of the first drain voltage, the first gate voltage, the first body voltage, and the first source voltage are equal to an amplitude of the RF signal.

20. The apparatus of claim 19, wherein the means for controlling the attenuation path comprises:

a second attenuation path MOSFET connected by a drain node to a source node of the first attenuation path MOSFET and connected by a source node to ground, wherein the another biasing network is configured to generate, for the second attenuation path MOSFET, a second drain voltage, a second gate voltage, a second body voltage, and a second source voltage from the attenuation path control voltage, wherein respective amplitudes of the second drain voltage, the second gate voltage, the second body voltage, and the second source voltage are equal to an amplitude of the RF signal.

\* \* \* \* \*